United States Patent [19]

Nadler

[11] 4,058,806
[45] Nov. 15, 1977

[54] ANALOG/DIGITAL CONVERTER

[76] Inventor: Morton Nadler, 17 Les Huppes, 78170 La Celle Saint Cloud, France

[21] Appl. No.: 668,192

[22] Filed: Mar. 18, 1976

[30] Foreign Application Priority Data

Apr. 2, 1975 France .............................. 75.10216

[51] Int. Cl.² .......................................... H03K 13/175
[52] U.S. Cl. ............................................ 340/347 AD
[58] Field of Search ................... 340/347 M, 347 AD; 307/235 N, 235 P

[56] References Cited

U.S. PATENT DOCUMENTS

| 3,806,915 | 4/1974 | Higgins | 340/347 AD |
| 3,877,025 | 4/1975 | Maio | 340/347 AD |
| 3,935,569 | 1/1976 | Marcel | 340/347 AD |

Primary Examiner—Charles D. Miller
Attorney, Agent, or Firm—Bucknam and Archer

[57] ABSTRACT

A procedure for the parallel conversion of an analog signal to a cyclic binary code with one comparison to a threshold per channel, or bit, in which each channel is composed of an analog function generator, characterized by the fact that the transfer function of said generator is constructed in a piecewise-linear manner from a certain number of pairs of segments of straight lines, whose input/output slopes have equal absolute values and opposite signs, where in each pair the lower instantaneous value is selected by an operator MIN, of two arguments, and among all the lower instantaneous values thus selected, the greatest instantaneous value is selected by an operator MAX, of number of arguments equal to the number of pairs of segments that compose the said transfer function, in such manner that the value of the code is zero or one according to whether the instantaneous value at the output of the said function generator is below the value of the threshold of a comparator or above.

9 Claims, 12 Drawing Figures

ANALOG/DIGITAL CONVERTER

BACKGROUND OF THE INVENTION

This invention relates to economical, accurate, and high-speed means for the conversion of analog signals to digital codes, more particularly, to codes with the unit-distance property, also known as Gray codes or cyclic binary codes. The process of converting analog electrical signals to digital codes is indispensible for the digital processing of information represented by these signals. With the enormous decrease in cost of digital processing in recent years with the appearance of integrated microprocessors, such processing is becoming universal. It appears in measuring instruments, process control, planned systems for automobile fuel economy and pollution reduction, in radar systems, in data transmission, exchange of television programs between countries with divergent standards, the processing of images in earth resources inventory from satellite photographs and medical imagery of different sorts, and other branches of technology, science, and industry.

A great diversity of analog/digital converters intended for these applications is known, and the state of the art is well described, for example, in the proceedings of the Symposium on Analog/Digital Conversion, held at the Swiss Federal Polytechnic Institute of Lausanne in 1973, "Comptes Rendus des Journées d'Electronique 1973 sur le thème Conversion A/D & D/A", EPFL, Lausanne, October, 1973.

To obtain fast and accurate conversion, such as is necessary for radar, television, and similar applications, the only hitherto known means is the so-called "parallel converter", in which the signal to be converted is compared to a multiplicity of reference voltages, each voltage representing one of the possible discrete values of the encoded output signal. Thus, if the signal is to be encoded by $n$ bits, $2^n-1$ comparators must be used. Because comparators must transfer their outputs from one level, "high", to a second level, "low", for a very small change in input signal, they are required to have a very high "slew rate", which implies a high power consumption. An example of such a converter is shown on page 80 of the cited publication. Ideally, if there is no significant error in the comparators, all of the comparators whose thresholds are lower than the instantaneous value of the signal will have their outputs at one level, say low (or logical 0), and all of the comparators whose thresholds are above the instantaneous value of the signal will have their outputs at the other level, say high (or logical 1), with the possibility that one comparator, the comparator at the frontier between these two conditions, will have an indeterminate value. Thus, the signal to be converted is represented at the outputs of the comparators by a code in $2^n-1$ bits. Following the bank of comparators, therefore, is an encoder, that transforms the code in $2^n-1$ bits to a code in $n$ bits. To avoid difficulties due to signal fluctuation during this encoding process, which is not instantaneous, such encoding is conveniently done in a binary reflected or unit-distance code, also called Gray code, after its inventor, and described in U.S. Pat. No. 2,632,058 of Mar. 17, 1953. This code has the property that only one bit changes at a time in going from one encoded value to another, so that if the input signal varies during the encoding time, the resulting uncertainty affects only one bit, provided that the signal fluctuation has a magnitude that passes from one level to an adjacent one only.

The properties of the Gray code have been exploited in a cascade converter, in which only one comparator per bit of output code is required, as described in the article by B. D. Smith, "An unusual electronic analog-digital conversion method", IRE Trans. on Instrum., PGI-5, June, 1956, pp. 155-160. However, in high-precision converters, involving 8 or more bits, the accumulation of static and dynamic errors in the cascade converters make them difficult of realization.

An attempt is also known to provide an analog-digital conversion process which combines the advantages in high-speed and accuracy of the parallel conversion with the property of the cascade-Gray conversion that only one comparison per bit is required.

In Federal German Pat. No. 1,268,196, filed July 26, 1966, Jungmeister describes a parallel Gray-code analog/digital converter in which the properties required of the various channels, one channel per bit, are obtained by a method of compensation of two highly non-linear transfer characteristics, actuating a bistable device with hysteresis nonlinearity, in the embodiment given there a tunnel diode. The nonlinear characteristics are obtained by series-parallel combinations of resistors and ordinary diodes, and are specific to each channel. The disadvantages of such an approach are two-fold. As is well known, the scatter of the switching characteristics of tunnel diodes is such that unless each channel is individually aligned, which precludes large-scale production by automatic techniques, the uncertainties of switching level render the device unusable for high accuracies and, secondly, the variations in voltage drop across the ordinary diodes used to obtain the nonlinear characteristics will have the same result.

SUMMARY OF THE INVENTION

It is accordingly an object of this invention to provide a parallel Gray-code analog/digital converter that conserves the advantages of the simplicity and economy of the cascade-Gray conversion, while providing a parallel conversion in which the static and dynamic errors of each channel are independent. A further object of the invention is to provide a converter wherein the structure of each channel is such that it is easily adapted to large-scale series production, including, in certain embodiments of the invention, monolithic integrated circuit semiconductor technology. Another object of the invention, even in those embodiments wherein, for reasons of highest attainable speed or highest attainable accuracy, the volume of circuitry required approaches that of the known parallel converters already mentioned, the invention makes it possible that the great majority of the active circuit elements consists of operational amplifiers that need not have the high "slew rate" of the comparators, while only $n$ comparators are needed for $n$ output bits, thereby reducing the cost and power consumption of the converter.

Other characteristics and advantages of this invention will become apparent from the description that follows.

BRIEF DESCRIPTION OF THE DRAWINGS

FIG. I represents an overall block diagram of an analog/digital converter according to this invention, in a parallel Gray code embodiment for four bits of output code.

DESCRIPTION OF THE PREFERRED EMBODIMENTS

The invention will now be described by reference to the appended figures. On the drawings, same reference numbers are given to individual circuit lines or directly connected lines and same reference numbers are given to any given component.

Figure 1:
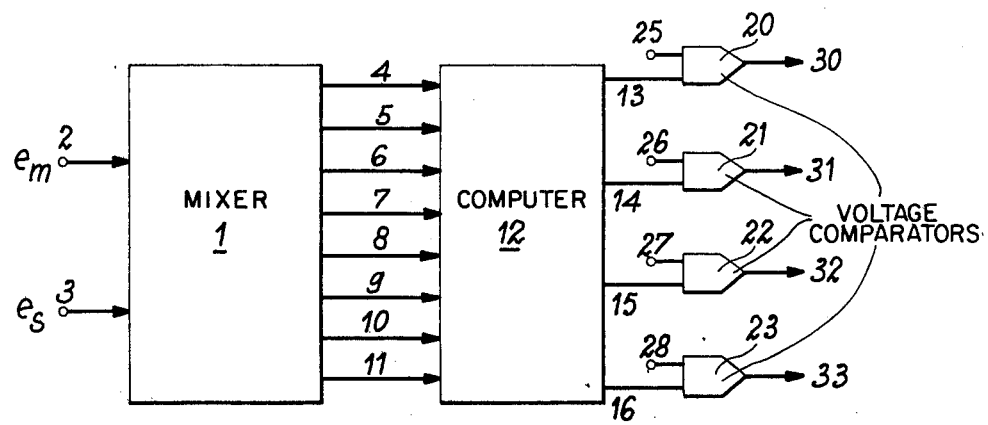

FIG. 1 represents an overall block diagram of a converter according to the invention. A mixer 1 adds various fractions of a reference voltage 2, equal to the maximum excursion $e_m$ of the signal to be converted $e_s$, to the signal to be converted 3, resulting in a family of intermediate signals 4–11, supplied to an analog computer 12. The analog computer furnishes various functions of the intermediate signals 4–11, using operators MAX and MIN, resulting in one output signal per channel of code, in the example represented by FIG. 1, the four signals 13–16. These signals are fed to as many comparators, 20–23, likewise supplied with voltages 25–28 equal to certain fractions of the reference voltage (same as 2), said fractions defining the thresholds of the comparators. The comparators supply at their outputs 30–33 voltages representing the digital code corresponding to the instantaneous value of the input signal 3. These digital signals may be sampled and stored in a flipflop register in the well-known manner, not indicated here and not forming part of the present invention.

Figure 2A:
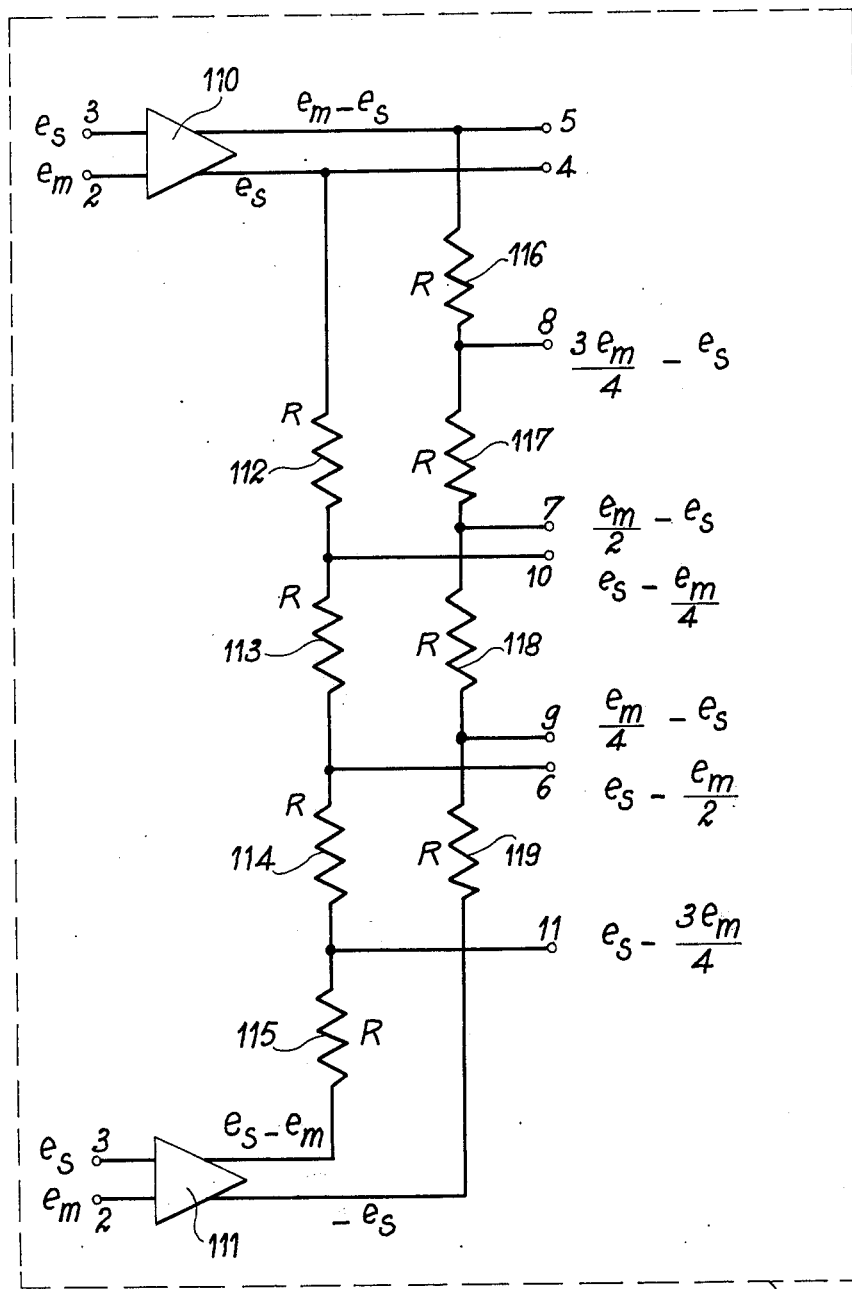
FIG. 2a to 2c represent one embodiment of the invention, in which the greatest economy of means is obtained.
Figure 2B:
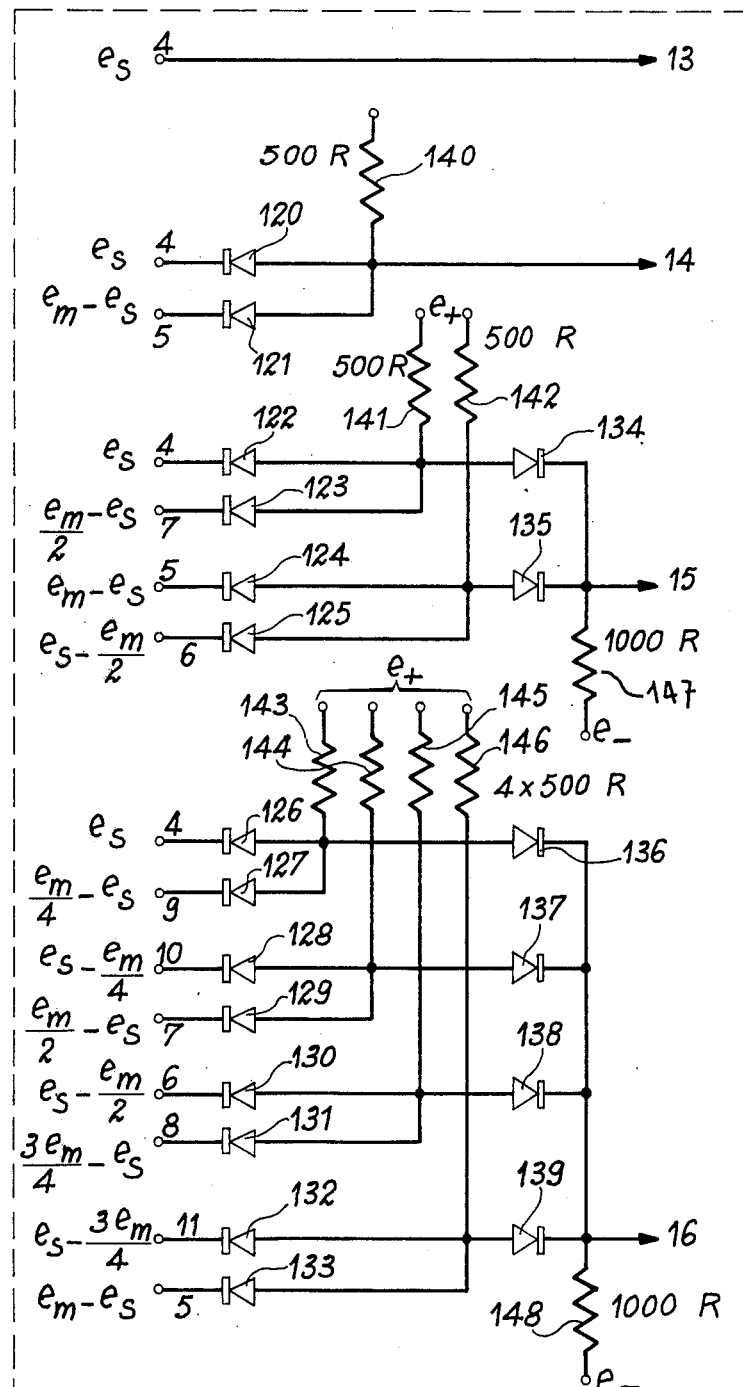
Figure 2C:
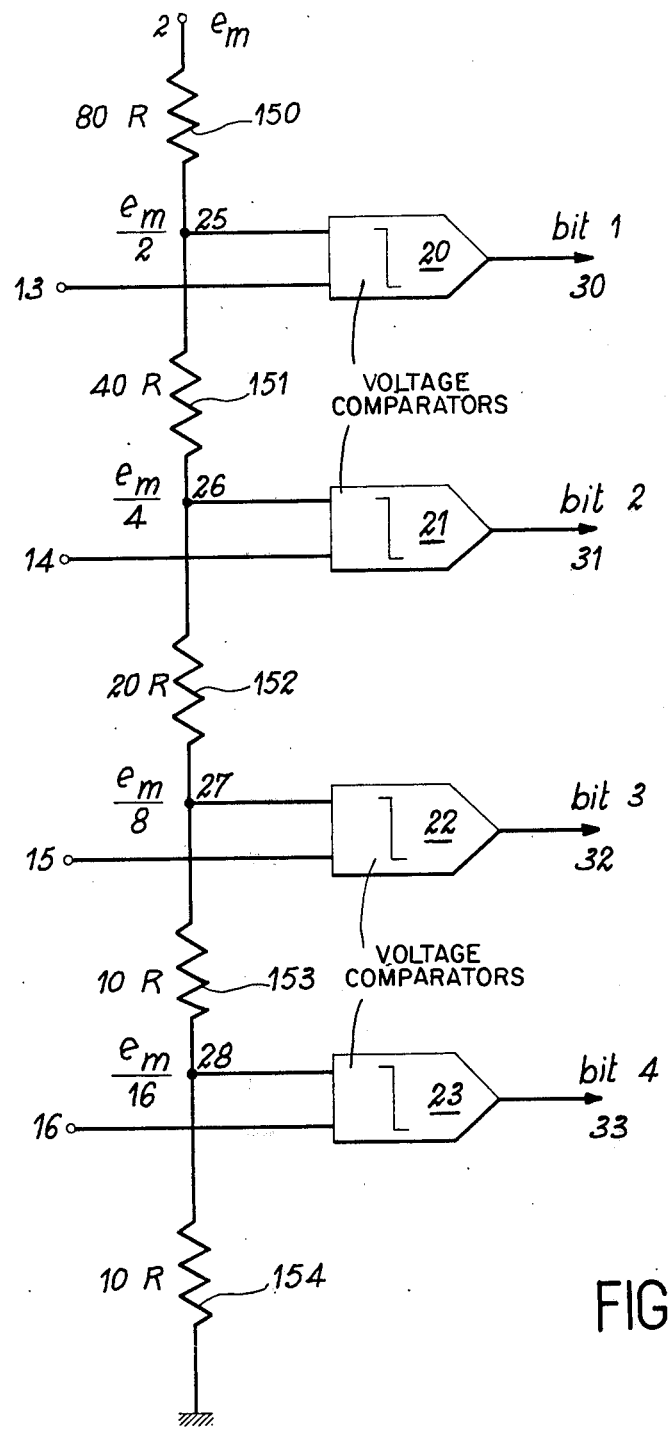

FIG. 2a to 2c represent one embodiment of the invention, in which great economy of means is obtained. In FIG. 2a is represented the mixer 1, consisting of two symmetrical operational amplifiers 110 and 111, whose outputs are interconnected by the resistive voltage dividers 112–115 and 116–119, whose input signals are the reference voltage, equal to $e_m$, and the analog signal to be converted 3 (signal voltage $e_s$), wherein $e_m$ is equal to the maximum excursion of $e_s$. An intermediate signal 4, equal to $e_s$, is obtained at one of the outputs of the operational amplifier 110, and another intermediate signal 5, equal to $e_m - e_s$ is obtained at the other output of the operational amplifier 110. The outputs of the other operational amplifier are $-e_s$ and $e_s - e_m$. The difference of output voltages between the two operational amplifiers can be obtained for example, by the use of complementary amplifiers, as is well known in semiconductor technology, or by all other appropriate circuit techniques. The other intermediate signals 6–11, appear at different taps of the voltage dividers, as shown in FIG. 2a. Both ends of the voltage dividers are supplied with the signal voltage in the same phase, either direct or inverted, but the reference voltage is supplied at only one end, either direct or inverted. The voltages appearing at the taps of one of the voltage dividers have respective values equal to $e_s - ke_m$, with $k$ uniformly increasing by equal increments and they constitute with signal 4 (for $k = 0$) a series of direct intermediate signals. At the taps of the other one of the voltage dividers, the voltages have respective values equal to $k'e_m - e_s$, with $k'$ uniformly increasing by same equal increments as $k$, and together with signal 5 (wherein $k' = 1$), they constitute a series of inverse intermediate signals. For a four-bits arrangement, the incremental increase of $k$ and $k'$ is ¼.

FIG. 2b represents the analog computer 12, utilising operators MAX and MIN to obtain the necessary input signals 14–16 for the comparators 21–23 of the four channels of the four-bits parallel-Gray converter. The diodes 120–133, polarized by the resistors 140–146, represent operators MIN but may be replaced by other well-known physical elements, such as source followers, using field-effect transistors (FET) to reduce the loading on the voltage dividers of mixer 1, or other appropriate circuit means. The diodes 134–139, polarized by the resistors 147 and 148 represent operators MAX, but may be replaced by similar appropriate circuit means.

Figure 3:
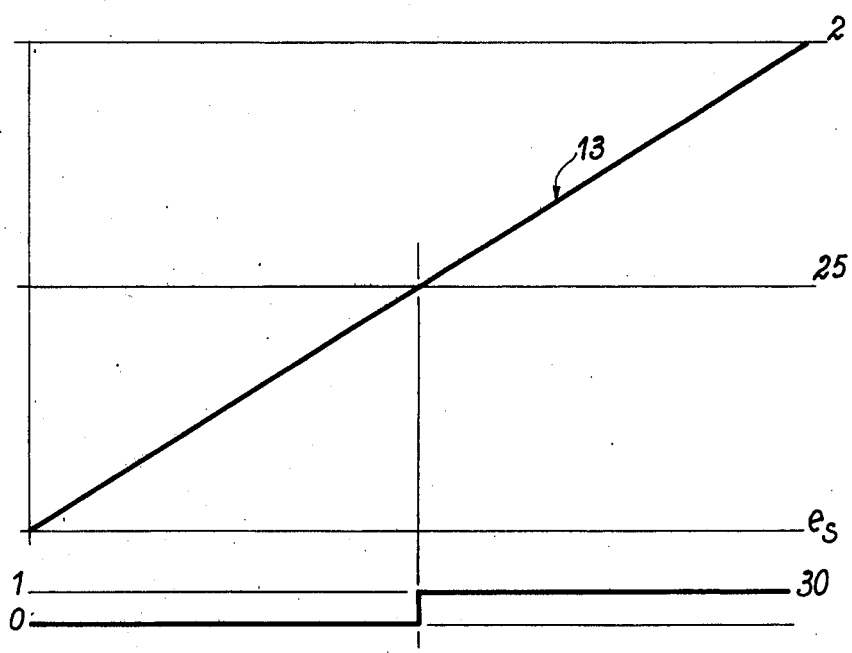
FIG. 3 represents the operation of the first channel of a parallel Gray-code converter.

FIG. 2c represents the array of comparators 20–23. The fractions of the reference voltage 3 necessary for the operation of the parallel converter are obtained by the voltage divider of graded resistors 150–154. Voltage dividers and comparators are well known, and need not be further described. In a four-bits arrangement as described the voltages obtained at 25, 26, 27, 28 are equal to $e_m/2$, $e_m/4$, $e_m/8$, $e_m/16$ respectively. FIG. 3 represents the functioning of the first channel of the converter, i.e., the channel that generates the first bit of the Gray code. The first bit of a Gray-code is identical with the first, or high-order of a straight binary code. Therefore the signal 13 is simply the signal 4, applied to the input of the comparator 20. The reference voltage 2, which is equal to the maximum signal voltage $e_m$ to be converted, is divided by a factor of two, to give the comparator threshold voltage 25, equal to $e_m/2$. The output voltage of the comparator is the two-valued, or binary signal 30, which is for instance high when the comparator input 13 is above the threshold 25, and low otherwise, these two states being indicated by the logical values 0 and 1 in the usual way. The functioning of the first channel of the converter, represented by FIG. 3, is known per se.

Figure 4:
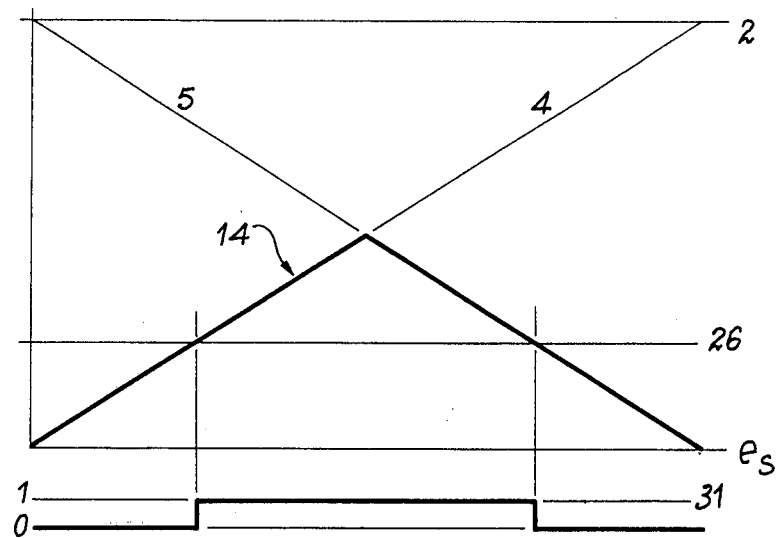
FIG. 4 represents the operation of the second channel of a parallel Gray-code converter.

FIG. 4 represents the functioning of the second channel of the converter, i.e., the channel that generates the second bit of the Gray code, which is identical to the functioning of a single stage of a cascade-Gray converter, described, for example, in the cited article by Smith. The input 14 to the comparator 21 is obtained by an operator MIN whose arguments are the two signals 4, 5, of equal and opposite slopes, referred to the input signal $e_s$, obtained from the mixer 1. The signal 4 is identical to the input signal 3 ($e_s$) while the signal 5 is the inverse signal represented by the expression $e_m - e_s$. The signal 14 is therefore given by the expression $$\text{MIN}(e_s, e_m - e_s) \tag{1}$$

This signal is applied to the input to the comparator 21, whose threshold voltage 26 is equal to $e_m/4$, resulting in the digital output 31, taking on the value 1 when the signal 14 is above the threshold 26 and the value 0 otherwise. The functioning of the second channel of the converter is also known per se.

Figure 5:
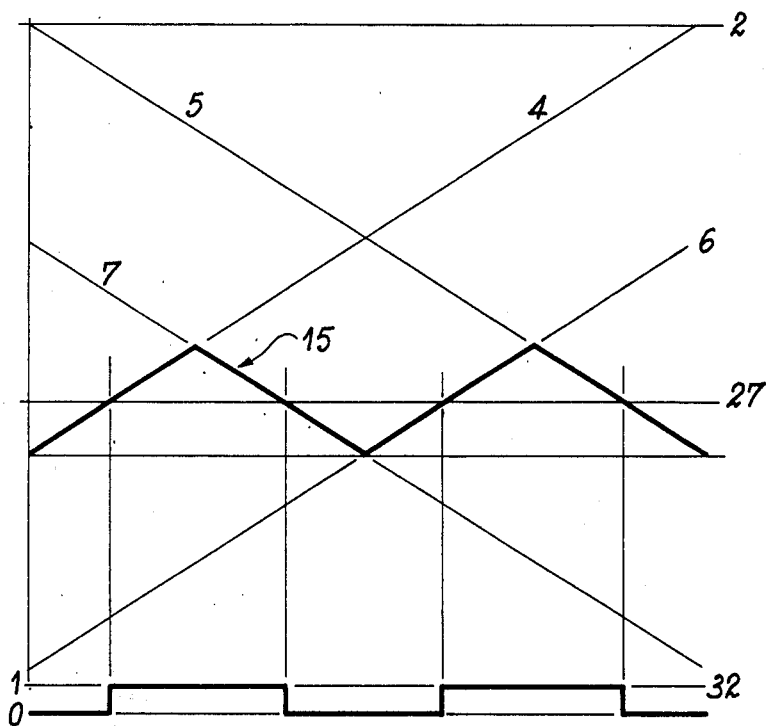
FIG. 5 represents the operation of the third channel of a parallel Gray-code converter.

FIG. 5 represents the functioning of the third channel of the converter, i.e., the channel that generates the third bit of the Gray code. The input 15 to the comparator 22 is obtained by an operation MAX(MIN) on the four signals 4, 5, 6, 7 obtained from the mixer 1. The signals 4 and 5 have already been discussed in connection with the formation of the signal for the second channel. Signal 6 is equal to $e_s - e_m/2$, and is obtained at a tap on the resistive voltage divider 112–115, and signal 7 is equal to $e_m/2 - e_s$ and is obtained at a tap on the resistive voltage divider 116–119. Signals 6 and 7 are inverses of each other. The signal 15 obtained through diodes 122–125 and 134–135 is given by the expression $$\text{MAX } [\text{MIN}(e_s, \frac{e_m}{2} - e_s), \text{MIN } (e_m - e, e_s - \frac{e_m}{2})] \quad (2)$$

This signal is applied to the input of the comparator 22, whose threshold voltage 27 is equal to $e_m/8$, resulting in digital output 32, taking on the value 1 when the signal 15 is above the threshold 27, and the value 0 otherwise.

Figure 6:
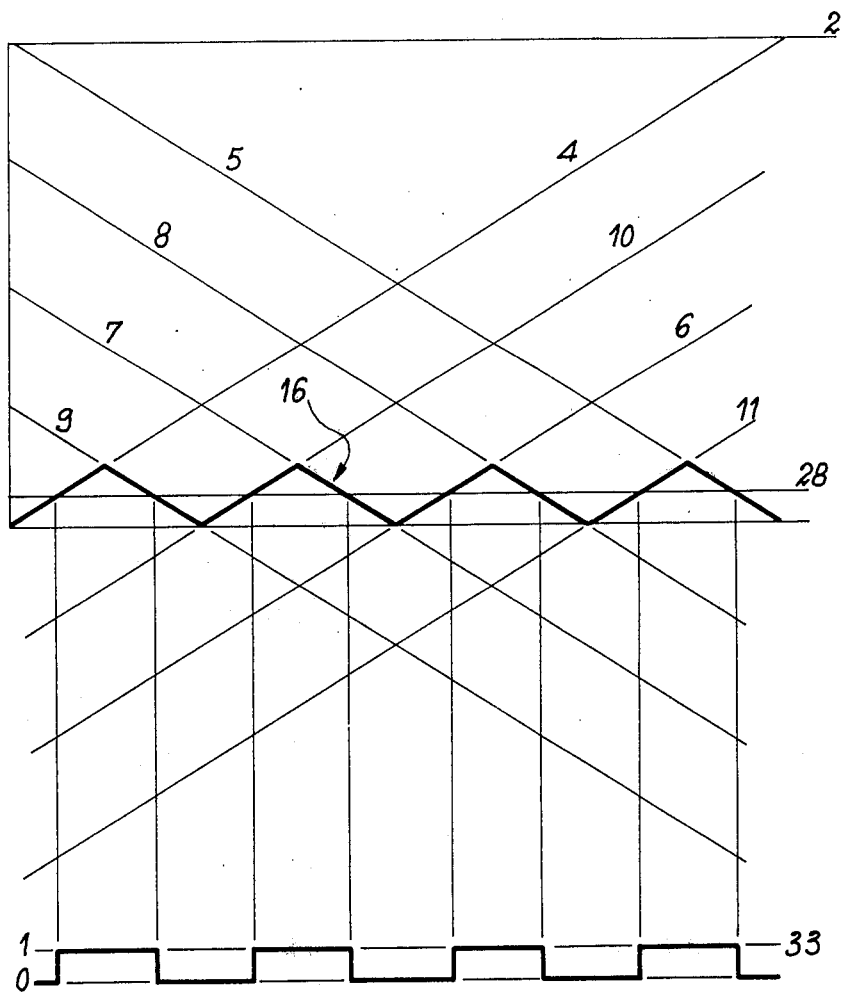
FIG. 6 represents the operation of the fourth channel of a parallel Gray-code converter.

FIG. 6 represents the functioning of the fourth channel of the converter, i.e., the channel that generates the fourth bit of the Gray code. The input 16 to the comparator 23 is obtained through diodes 126–133 and 136–139 connected as shown on FIG. 2b, by an operation MAX(MIN) on the eight signals 4–11 obtained from the mixer 1. The signals 4–7 have already been discussed in connection with the functioning of the second and third channels. The signal 8 is equal to $3(e_m/4) - e_s$, the signal 9 is equal to $e_m/4 - e_s$, the signal 10 is the inverse of signal 9, equal to $e_s - e_m/4$, and the signal 11 is the inverse of signal 8, equal to $e_s - 3e_m/4$. The signal 16 is then given by the expression $$\text{MAX}\left[\text{MIN }(e_s, \frac{e_m}{4} - e_s), \text{MIN }(e_s - \frac{e_m}{4}, \frac{e_m}{2} - e_s), \text{MIN }(\frac{3e_m}{4} - e_s, e_s - \frac{e_m}{s,164}), \text{MIN }(e_m - e_s, e_s - \frac{3e_m}{4})\right] \quad (3)$$

This signal is applied to the input of the comparator 23, whose threshold voltage 28 is equal to $e_m/16$, resulting in the digital output 33, taking on the value 1 when the signal 20 is above the threshold voltage 28, and the value 0 otherwise.

The law of formation of successive channels of the parallel-Gray converter is now evident from these examples. For each successive channel the number of signals supplied by the mixer 1 is doubled, half of the signals being those already supplied, and half of them being obtained by interpolating new signals, midway between those already supplied, in pairs that are inverse to each other. These signals are combined two-by-two in such manner that one direct and one inverse signal is combined by an operator MIN, and then the resulting signals are combined by a single operator MAX. For each successive channel the corresponding comparator threshold is halved.

More generally, considering a $n^{th}$ channel, generating the $n^{th}$ bit of a parallel converter of the invention, said channel is supplied with $p$ intermediate signals (half of them being direct signals and the other half being inverse signals), with $$p = 2^{n-1} \text{ and } k \text{ or } k' = \frac{i}{2^{n-2}}$$

and the signal for the $n^{th}$ bit, counting the first bit as of the form (1), is $$\underset{i=1}{\overset{2^{n-2}}{\text{MAX}}}\left[\text{MIN }(\frac{i}{2^{n-2}}e_m - e_s, e_s - \frac{i-1}{2^n}e_m)\right]$$

wherein the symbol $$\underset{i=1}{\overset{2^{n-1}}{\text{MAX}}}\left[\text{MIN }()\right]$$

signifies that operator MAX is taken over the outputs of $2^{n-1}$ operators MIN whose arguments are the expressions given in the parentheses.

Figure 7:
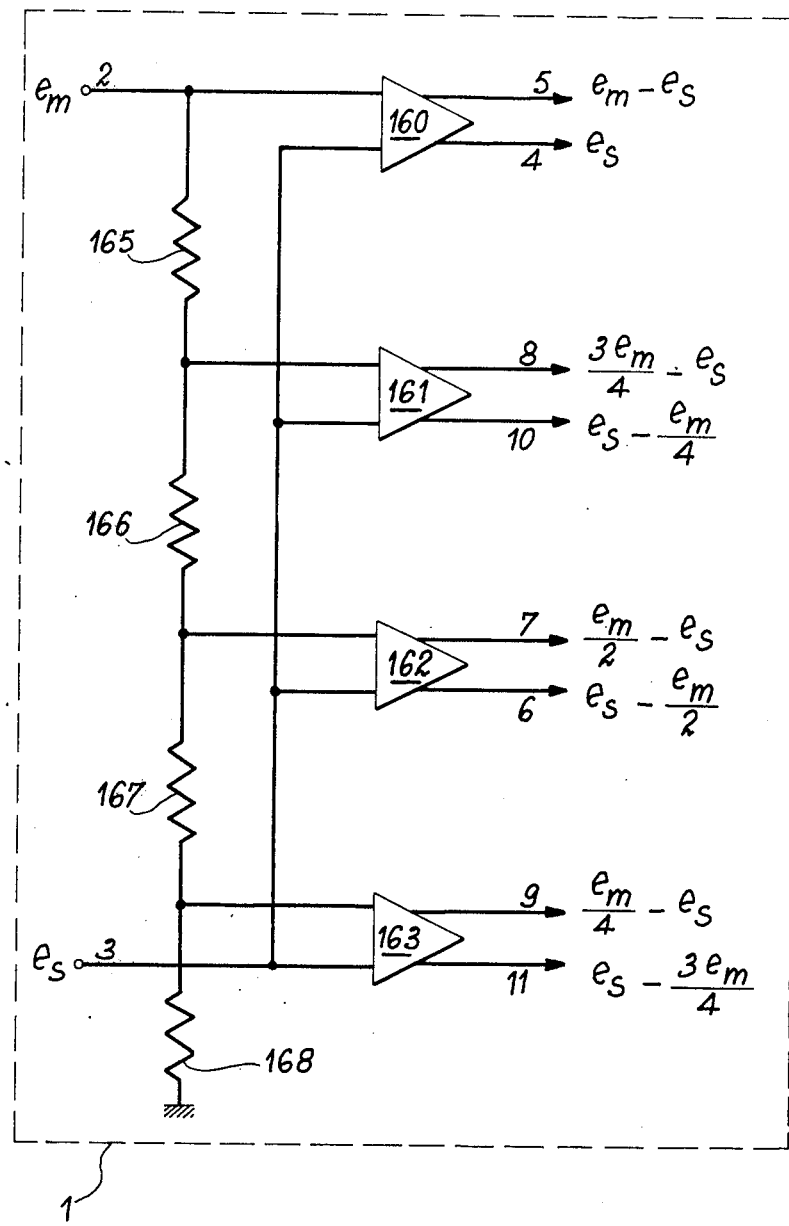
FIG. 7 represents a second embodiment of the invention, in which the greatest conversion speed is obtained.

When the mixer 1 is constructed from resistive voltage dividers and the analog computer by means of diodes, as shown in FIG. 2, the currents that flow through the polarization resistors 140–146 will introduce a slight static error into the signals 14–16 supplied to the comparators. Likewise, regardless of the form of embodiment of the operators MIN, their input capacitances will load the mixer outputs, and their output capacitances taken together with the polarization resistances also introduce a time constant, thereby causing dynamic errors at high conversion rates. Nevertheless the embodiment of FIG. 2 is suitable for monolithic technology at moderate conversion rates, especially when combined with a series-parallel design, as discussed further, in connection with FIG. 8. An improved embodiment, intended to eliminate the effects of loading on the mixer is represented in FIG. 7. The resistive dividers 112–115 and 116–119 are replaced by an array of symmetrical operational amplifiers 160–163 and a static voltage divider 165–168, at the inputs to the operational amplifiers 160–163, not carrying any components of $e_s$. The output voltages 4–11 of the mixer appear at the outputs of operational amplifiers 160–163, hence across very low impedances, and therefore the static and dynamic errors of the analog computer can be made negligible. The price for this improvement is that in place of the two operational amplifiers for each parallel converter shown in the embodiment represented by FIG. 2, the number of operational amplifiers required in the present embodiment will be $2^{n-2}$, where $n$ is the number of bits in the Gray code converted in parallel. Provided the spectrum of the signal to be converted decreases uniformly at high frequencies up to the cutoff frequency these operational amplifiers need not supply high slew rate, in contradistinction to the comparators, and therefore their cost and power consumption will be less. It will be noted that the total number of active elements in the converter counting operational amplifiers and comparators will be $2^{n-1}$, as compared with the $2^{n-1}$ comparators alone needed in the parallel converters hitherto known, resulting in a reduction by almost a factor of two in the complexity of the converter. Although the mixer outputs 6–11 show negative portions, in reality, since only the positive portions of the characteristics are selected by the analog computer for further transmission to the comparators, limiting amplifiers can be used; this is only for convenience and the limiting characteristic is in no way essential to this invention. The same result would be obtained by adding a constant to all the signals, to obtain characteristics that are everywhere positive.

Figure 8:
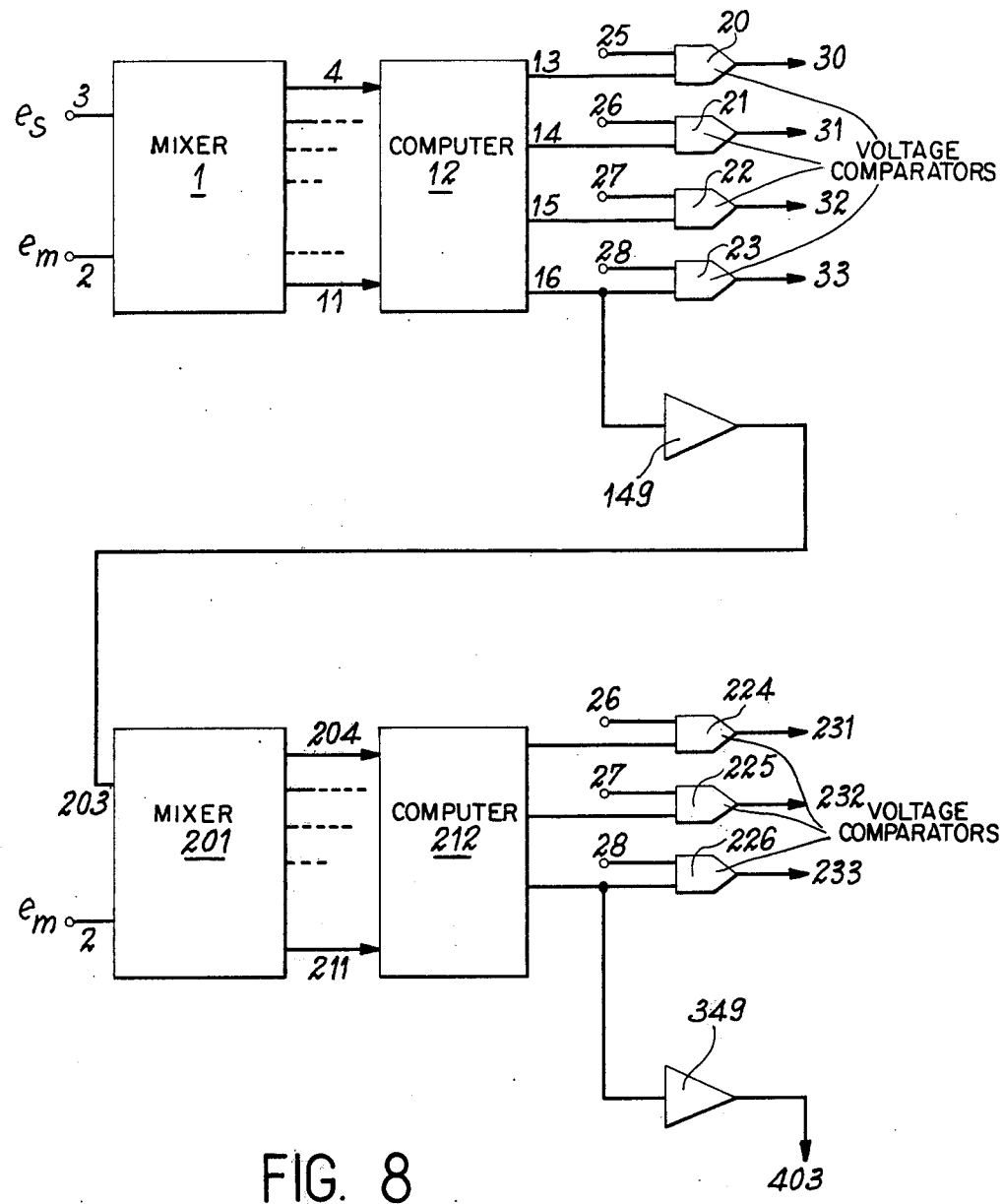
FIG. 8 represents a series-parallel embodiment of the invention, in which a compromise is made between speed and accuracy, on the one hand, and cost of material, on the other.
Figure 9:
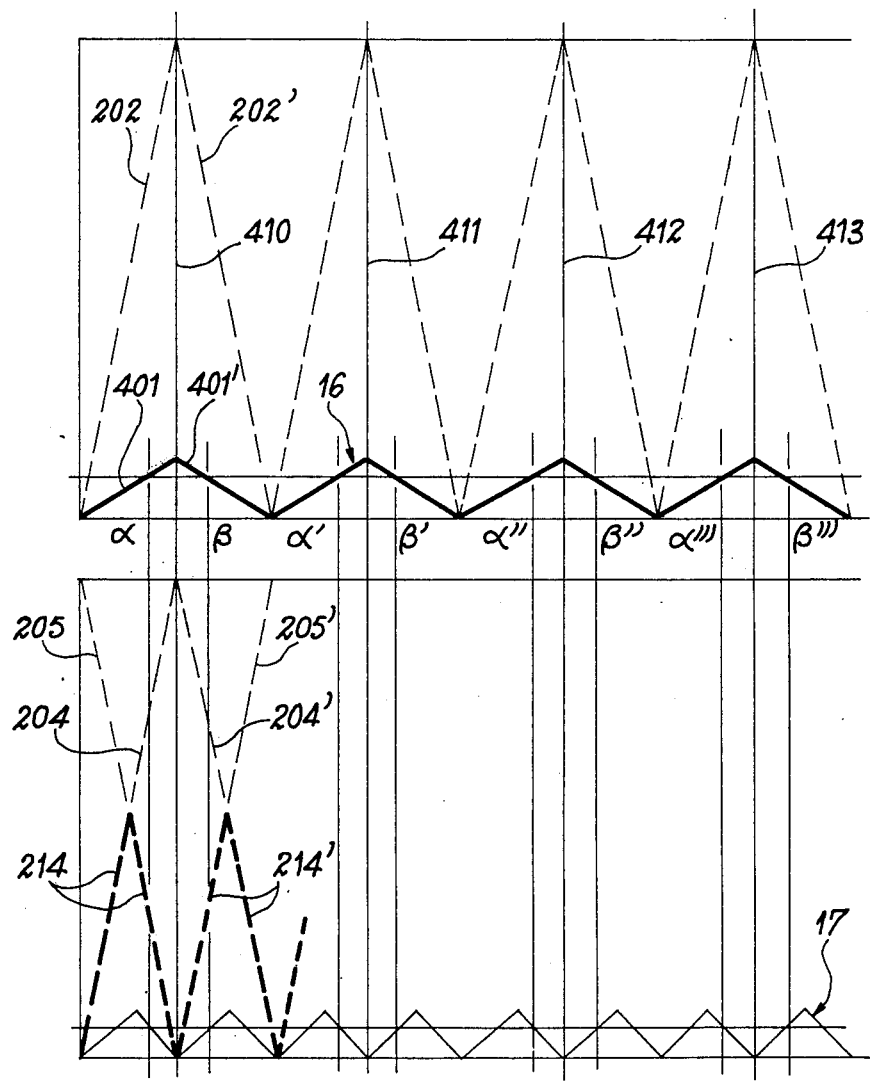
FIG. 9 represents the operating principle by which the successive modules of the series-parallel embodiment are coupled.
Figure 10:
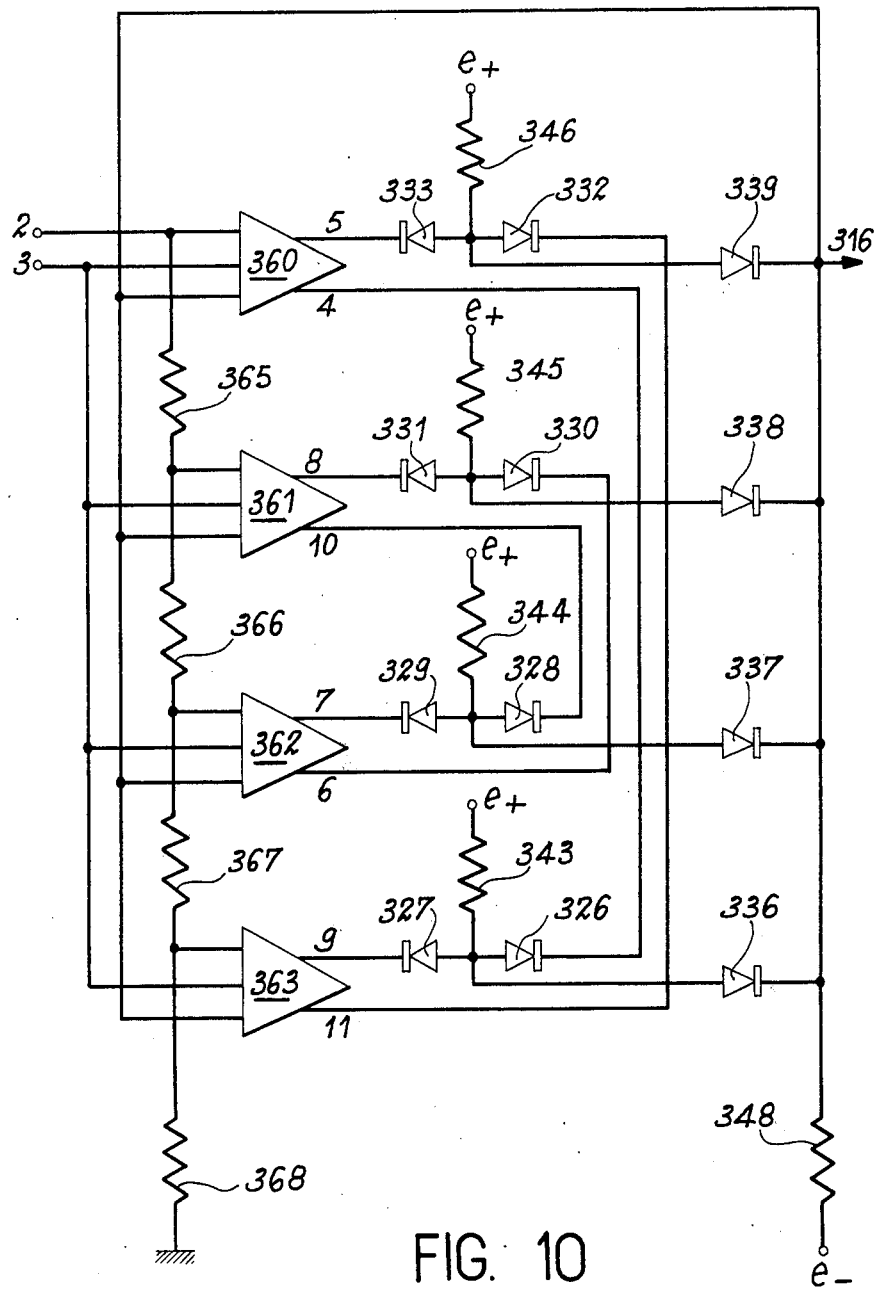
FIG. 10 represents one channel of an embodiment in which the highest possible accuracy is obtained.

Although the polarization resistors 140–146 and 147–148 can be dimensioned in such a way that the currents through the two conducting diodes in the analog computer in one channel at any one time are equal, and although the diodes can be selected or monolithically manufactured in such a way to reduce the differences in voltage drops across the diodes, small differences may still remain. For example, for one class of Schottky diodes the guaranteed differences of voltage drop between any two diodes will be of the order of magnitude of 5 mV. Considering a well-known semiconductor technology, the maximum signal excursion $e_m$ can be conveniently of the order of 5 V. Then the scatter in the diode characteristics will represent $10^{-3}e_m$. The reference voltages of the comparators are equal to $ke_m$, where k is a negative power of 2. Indeed, for a 10-bit converter, the dispersion of diode characteristics will cause an appreciable inaccuracy of conversion for more than, say, 8 bits in parallel. Aside from this, the exponential growth in the number of active elements in the parallel converter makes it prohibitively complicated for large $n$. FIGS. 8, 9 and 10 show how to obtain a series-parallel embodiment in which the best compromise between speed and accuracy, on the one hand, and cost of material, on the other, can be obtained. Referring to FIG. 8, an operational amplifier 149 is connected at the output of the analog computer. It has a gain of 8 from input to output, and its output signal 203 serves as the input signal to the mixer of a parallel converter for the next group of bits, constructed on exactly the same principle as the three channels of the first module (or unit system) after the first channel. FIG. 8 repeats for clarity the block diagram of the four-channel module of FIG. I, and a second parallel module, containing a mixer 201, and analog computer 212, comparators 223–227, and an output amplifier 349, similarly to the first module. There is one important difference between the structure of the first module and all subsequent ones which I shall now explain. It will be recalled in the discussion to FIG. 3, the first channel of a parallel Gray converter according to the invention is identical with the first channel of an ordinary straight binary converter. The first channel of a subsequent module in a series-parallel Gray converter of the invention cannot be realized in the form of a straight binary channel, i.e., as a simple threshold operation on a linearly increasing transfer characteristic. Referring now to FIG. 9, I shall explain how the simple amplification of the output signal of the last channel of the preceding module creates the input signal for the subsequent module, whose first channel has the same form as the second channel of the first module. The upper part of FIG. 9 reproduces the transfer function 16 of the fourth channel of the converter, and in the lower part is the transfer function 17 that would be required of the fifth channel in a purely parallel version of the converter of the invention. In FIG. 9 are indicated on the characteristic 16 the output values for eight input values, namely $\alpha\lambda$, $\alpha'$, $\beta$, $\beta'$, $\alpha''$, $\beta''$, and $\alpha'''$, $\beta'''$. For purposes of illustration these input values have all been taken so as to give the same output values on the sawtooth-shaped output characteristic. It will be observed that to these output values there correspond equal output values on the characteristic 17 as well. The amplification of the output signal 16 to give the input signal 203 to the first channel of the next parallel module restores the range of the output values to $e_m$, as shown by the broken line in the figure. By virtue of the symmetry of the sawtooth transfer function about the axes of symmetry 410, 411, 412, 413, to the rising portion of a sawtooth 401 there corresponds a reflected falling portion 401'. Therefore, to the rising portion 203 there correspond in the first channel of the next module, constructed according to the characteristic of FIG. 4 the characteristics 204 and 205, corresponding in the first module to characteristics 4 and 5, and combined by the law of Eq. 1. to give the characteristic 214, corresponding in the first module to characteristic 14, and to the falling portion 203' there correspond the characteristics 204' and 205', related by reflection to the characteristics 204 and 205, and giving rise in the same way to the characteristic 214'. Analogous relations hold for all the other segments of characteristics 16 and 17 so that in this way a channel constructed according to FIG. 4 will yield for the amplified signal of a channel constructed according to FIG. 6 the same result as a channel constructed according to 17 in FIG. 9. This same principle can be used after any last channel of a parallel module to supply the input signal $e'_s$ to a subsequent module, where the successive channels are designed according to the successive channels already described, starting with the channel represented by FIG. 4 and Eq. (1).

In the second module of FIG. 8 the transfer function of the signal 214 will correspond to that of the signal 14 in the first module, the signal 215 to signal 15, and the signal 216 to 16, and so on. In large-scale production, and using integrated circuits, it is of interest to render the successive modules of a series-parallel design as identical as possible. For example, the first channel may be removed from the first module of the series-parallel converter, since the input signal $e_s$ applied directly to the first comparator will have the same effect. Then the total number of bits will be $mn+1$, where m is the number of identical modules in series, n is the number of bits converted in parallel in each module, and the +1 accounts for the first bit. In particular, for bipolar signals, the first bit will represent the instantaneous sign of the signal. In this case the number of operational amplifiers in an embodiment according to FIG. 7 will be $2^{n-1}$, double the number given above, in each module, but the total number in the converter will be $m2^{n-1}$ instead of $2^{mn-2}$, resulting in an economy of $$\frac{2^{n(m-1)-1}}{m}$$

times.

In this series-parallel version the errors due to the dispersion in diode characteristics mentioned above will be amplified by the matching amplifiers appearing between the modules, and will therefore affect the accuracy of subsequent modules at higher thresholds than in the straight parallel version. In the numerical example given above, the diode mismatch is significant at the tenth bit. The gain of 8 introduced by amplifier 149 will make the mismatch voltage 40 mV instead of 5mV. The first threshold in the second module, 226 will be equal to $e_m/4$, the second threshold 227 will be equal to $e_m/8$, and so on. The 40 mV threshold will be reached at $e_m/2^7$, or the sixth channel of the second module, if one were provided. Therefore the error introduced by the amplified mismatch of the last channel of module one dominates over the mismatch due to the dispersion of the diode characteristics in the proper channel of the second module, and we can consider that the total number of channels that may be used in the series parallel version due to the effects of dispersion in the diode characteristics remains the same in the straight parallel or the series-parallel embodiments.

A technique is known that will reduce the mismatch error due to the diodes or other circuit implementations of the operators MAX, MIN to negligible levels. Considering the overall structure in the embodiment represented in FIG. 7, of the converter, we see that the mixer and analog computer taken together form a set of function generators. Considering the function generator of a single channel, we see that it consists of an array of operational amplifiers, their outputs being combined in a piecewise-linear manner by only the operators MAX, MIN.

The introduction of a common negative feedback loop from the common output point to the input of each operational amplifier will reduce the errors introduced by the operators MAX, MIN themselves by the usual factor of improvement of feedback amplifiers, namely by the factor of A-1, where A is the gain of the amplifier before feedback. Since operational amplifiers generally have gains superior to $10^3$, the reduced mismatch error will be referred to the 20th bit of a code, i.e., to levels where from other technological considerations as well as from considerations of practical application a converter according to this invention will not be required to operate.

The application of this technique to the present invention will be understood by reference to FIG. 10. In this figure, the reference numbers of analogous elements to those of FIG. 7 and FIG. 2b have the same last digits. Thus, to the signal 16 in FIG. 2b corresponds the signal 316, to the operational amplifier 160 in FIG. 7 corresponds the operational amplifier 360, etc. Consider that the relationship between the input voltages, including the feedback signal, and the output voltage of the entire channel is given by the following equations:

$$e_i = e_s + e_k - e_O \quad (4)$$

$$e_O = A e_i + \delta \quad (5)$$

wherein $e_i$ is the effective input to the amplifier, taking the negative feedback into account, $e_s$ is the input signal to be converted, and $e_k$ is the fraction of the reference voltage $e_m$ injected into the given amplifier of the given channel, $e_O$ is the output voltage of the function generator at the point 320 where the feedbacks are taken, A is the amplification factor of the amplifier without feedback and is a negative number to take into account the inversion of the signal required for negative feedback, and $\delta$ is the total error due to all causes from the effective input to the amplifier $e_i$ to the true output 316. Combining (4) and (5), we obtain $$e_O = \frac{A}{1+A}(e_s + e_k) + \frac{\delta}{1+A} \quad (6)$$

so that in this case, where the input signal is shifted by the constant $e_k$, the output voltage is $A/(1+A)$ of the shifted input signal, while the error $\delta$ is reduced by the factor of $1+A$, as expected. When A is large enough, the difference $\delta'$ between unity and $A/(1+A)$ can be corrected by appropriate circuit means, and will be insensitive enough to variations in A that errors due to the variations in A will be of the same order of magnitude as the residual error $\delta/(1+A)$. To see this, we have only to calculate this difference:

$$\delta' = 1 - \frac{A}{A+1} = \frac{1}{A+1} \quad (7)$$

and the derivative of $\delta'$ with respect to A:

$$\frac{d\delta'}{dA} = \frac{-1}{(A+1)^2} = \frac{\delta'}{A+1} \quad (8)$$

It will be appreciated, however, that the introduction of negative feedback in this way renders the outputs of the mixer for a given channel unsuable for the other channels in the same module of the converter, contrary to what we have seen before the introduction of the feedback. However the feedback is only necessary in the last channel of a module from which the input of the next module will be driven over a level-restoring amplifier. Considering the embodiment described above, with the first bit of the Gray code converter separately from the first parallel module, followed by the series-parallel combination of m modules of n bits in parallel each, we would require $2^{n-2}$ operational amplifiers for the first $n-1$ bits in the module, and $2^{n-1}$ operational amplifiers for the nth bit with feedback according to the embodiment represented by FIG. 10, and one operational amplifier to drive the next module, or a total of $3 \cdot 2^{n-2} + 1$ operational amplifiers per module. Different variants and combinations of the embodiments described here will be apparent to one well versed in the art, to obtain the embodiment of the invention best suited to each particular application. Other alternative embodiments will be easily developed by those skilled in the art and still be included within the scope of the claims. Thus, although the description and the claims always refer to positive reference and analog signals for the sake of clarity, the invention applies as well to negative signals, in which case MIN operators should be substituted for MAX operators and vice-versa. The modifications involved in the circuits will be obvious to those skilled in the art.

What I claim is:

1. A process for analog to digital conversion using a Gray digital code, wherein one at least of the bits of the digital code is obtained by:

supplying to a channel a number p of intermediate signals generated from an analog signal $e_s$ to be converted and a reference signal $e_m$ of fixed value equal to the maximum excursion of said analog signal, with p being a power of 2 and at least equal to 4, wherein a first half of said intermediate signals are formed by a series of p/2 successive direct signals having successive respective values equal to $e_s - ke_m$ with k uniformly increasing from 0 by equal increments of $2/p$, and a second half of said intermediate signals are formed by a series of $p/2$ successive inverse signals having successive respective values equal to $k'e_m - e_s$, with $k'$ gradually increasing from $2/p$ by equal increments of $2/p$, associating each successive direct signal with each successive inverse signal, thereby forming $p/2$ successive pairs of intermediate signals, determining in each pair the signal of minimum value, thereafter determining the signal of maximum value among all signals of minimum value from the various pairs, and comparing said signal of maximum value with a threshold signal having a fixed value equal to $e_m/2p$.

2. A process for analog to digital conversion using a Gray digital code comprising:

supplying to each of at least two channels in parallel, a number $p$ of intermediate signals generated from an analog signal $e_s$ to be converted and a reference signal $e_m$ of fixed value, equal to the maximum excursion of said analog signal, with $p$ gradually increasing, taking the successive powers of 2 (from at least the 1st power), from each channel to the next one, wherein a first half of said intermediate signals are formed by a series of $p/2$ successive direct signals having successive respective values equal to $e_s - ke_m$ with $k$ gradually increasing from 0 by equal increments of $2/p$, and a second half of said intermediate signals are formed by a series of $p/2$ successive inverse signals having successive respective values equal to $k'e_m - e_s$, with $k'$ gradually increasing from $2/p$ by equal increments of $2/p$, grouping in each channel said intermediate signals by pairs of each successive direct signal with each successive inverse signal, and determining the signal of minimum value in each pair, determining in each channel the signal of maximum value among all signals of minimum value from the various pairs, comparing the signal of maximum value from each channel with a respective threshold signal having a fixed value equal to $e_m/2p$, and producing from the results of said comparison in the successive channels, successive bits of a digital code.

3. A process according to claim 2, wherein the first bit of said digital code is obtained by comparing the analog signal $e_s$ with a threshold signal having a value half that of said reference signal $e_m$, said reference signal having the value of the maximum excursion of $e_s$.

4. A process according to claim 2, comprising using three different channels and supplying said channels with 2, 4 and 8 intermediate signals respectively, comprising respectively 1, 2 or 4 intermediate signals of each of said series.

5. A process according to claim 3, comprising producing the second and third bits of said digital code from two channels supplied with 2 and 4 intermediate signals respectively.

6. A process according to claim 2, wherein the signal of maximum value from the last channel of a first unit comprising at least two of said channels, is used as the analog signal in another similar unit comprising at least two of said channels.

7. Analog-digital converter comprising:

mixing means for generating and supplying to each of at least two channels in parallel, a number $p$ of intermediate signals generated from an analog signal $e_s$ to be converted and a reference signal $e_m$ of fixed value, equal to the maximum excursion of said analog signal, with $p$ gradually increasing, taking the successive powers of 2 (from at least the first power), from each channel to the next one, wherein a first half of said intermediate signals are formed by a series of $p/2$ successive direct signals having successive respective values equal to $e_s - ke_m$ with $k$ gradually increasing from 0 by equal increments of $2/p$, and a second half of said intermediate signals are formed by a series of $p/2$ successive inverse signals having successive respective values equal to $k'e_m - e_s$, with $k'$ gradually increasing from $2/p$ by equal increments of $2/p$, in each of said channels means to supply said intermediate signals by pairs of each successive direct signal with each successive inverse signal, to circuit means comprising respective MIN operators for determining the signal of minimum value in each pair, in at least the second one of said channels, circuit means comprising a MAX operator for determining the signal of maximum value of all the output signals from the MIN operators in the respective channel, comparators for comparing the output signal from the MAX operator of each channel with a respective threshold signal having a fixed value equal to $e_m/2p$, from the respective successive channels.

8. Converter according to claim 7, comprising at least two converting unit systems in series each comprising similar mixing means, parallel channels, and comparators, and circuit means to amplify the output signal from the last channel of one unit system up to an amplified signal having a maximum excursion equal to $e_m$ and to supply said amplified signal as the reference signal to the next unit system.

9. A converter according to claim 7, wherein said mixing means comprise dividing circuit means to produce from the reference signal divided signals of equally incrementing values, and operational amplifiers to produce from said divided signals and said analog signal all said intermediate signals for the various channels.

* * * * *